(12) United States Patent
Otto et al.

(10) Patent No.: US 6,762,673 B1
(45) Date of Patent: Jul. 13, 2004

(54) CURRENT LIMITING COMPOSITE MATERIAL

(75) Inventors: Alexander Otto, Chelmsford, MA (US); Ralph P. Mason, Chelmsford, MA (US); Craig J. Christopherson, Worcester, MA (US); Peter R. Roberts, Groton, MA (US); Steven Fleshler, Brookline, MA (US); Gilbert N. Riley, Jr., Marlborough, MA (US); Swarn S. Kalsi, Shrewsberry, MA (US); Gregory L. Snitchler, Shrewsberry, MA (US); Robert C. Diehl, Holden, MA (US); Dietrich Bonmann, Meckenheim (DE); Martin Lakner, Bimenstorf (DE); Willi Paul, Wettingen (DE); Harry Zueger, Geneva (CH)

(73) Assignees: American Superconductor Corp., Westborough, MA (US); ABB Transmission & Distribution Technologies, Ltd., Zurich (CH)

(*) Notice: Subject to any disclaimer, the term of this patent is extended or adjusted under 35 U.S.C. 154(b) by 0 days.

(21) Appl. No.: 09/488,742

(22) Filed: Jan. 20, 2000

Related U.S. Application Data

(63) Continuation-in-part of application No. 09/274,438, filed on Mar. 22, 1999, now abandoned, which is a continuation-in-part of application No. 09/240,998, filed on Feb. 1, 1999, now Pat. No. 6,188,921, which is a continuation-in-part of application No. 09/200,411, filed on Nov. 25, 1998, now Pat. No. 6,657,533, which is a continuation-in-part of application No. 09/132,592, filed on Aug. 11, 1998, now abandoned.

(60) Provisional application No. 60/074,258, filed on Feb. 10, 1998.

(51) Int. Cl.[7] .............................................. H01C 10/14

(52) U.S. Cl. .................... 338/32 S; 338/13; 174/125.1; 505/881

(58) Field of Search ................................. 338/32 S, 13, 338/20, 21; 174/125.1, 15.4, 15.5; 505/881, 238

(56) References Cited

U.S. PATENT DOCUMENTS

| 3,743,986 A | * | 7/1973 | McInturff et al. ........... 335/216 |
| 4,079,187 A | * | 3/1978 | Fillunger et al. ......... 174/15 S |
| 4,251,328 A |   | 2/1981 | Tunder |

(List continued on next page.)

FOREIGN PATENT DOCUMENTS

| DK | DE 197 46 975 C 1 | 10/1997 |
| EP | 0 769 819 A1 | 4/1997 |
| EP | 0 786 783 | 7/1997 |

(List continued on next page.)

OTHER PUBLICATIONS

Lay, et al., "Over Critical–Current Behavior of Bi–2223 Tapes" *IEEE Transactions on Applied Superconductivity.*, 9 (2):1324–1327, Jun., 1999.

Hikichi, et al., "Development of Ag–Mg–α Alloy Sheathed Bi2223 Multifilament Tapes"_(*Proceedings of the 11th International Symposium on Superconductivity*) 915–918, Fukuoka, Japan, Nov., 1998.

*Primary Examiner*—Elvin G. Enad
*Assistant Examiner*—K. Lee
(74) *Attorney, Agent, or Firm*—Choate, Hall & Stewart; Elizabeth E. Nugent

(57) ABSTRACT

An elongated current limiting composite material comprising one or more high-temperature superconductor filaments and a second electrically conductive member, which may include a sheath of high bulk resistivity surrounding the filament. The current limiter exhibits dissipation in the range of 0.05–0.5 V/cm at currents of 3–10 times the operating current, thereby minimizing fault currents and improving recovery capability.

31 Claims, 3 Drawing Sheets

U.S. PATENT DOCUMENTS

| | | |
|---|---|---|
| 4,454,380 A | 6/1984 | Turowski |
| 4,700,257 A | 10/1987 | Bekhaled |
| 4,954,479 A * | 9/1990 | Dubots et al. ............... 505/1 |
| 4,994,633 A * | 2/1991 | Puhn ..................... 174/125.1 |
| 5,017,553 A | 5/1991 | Whitlow et al. |
| 5,296,456 A * | 3/1994 | Shiga et al. ................ 505/1 |
| 5,298,679 A | 3/1994 | Wu et al. |
| 5,304,534 A | 4/1994 | Ciszek |
| 5,617,280 A | 4/1997 | Hara et al. |
| 5,625,332 A | 4/1997 | Kamo et al. |
| 5,663,528 A | 9/1997 | Tanaka et al. |
| 5,828,291 A | 10/1998 | Baumann et al. |
| 5,912,607 A | 6/1999 | Kalsi et al. |
| 5,929,000 A | 7/1999 | Hahakura et al. |
| 6,188,921 B1 * | 2/2001 | Otto et al. ................ 505/230 |

FOREIGN PATENT DOCUMENTS

| | | |
|---|---|---|
| EP | 0 786 783 A1 | 7/1997 |
| JP | 6309955 | 11/1994 |
| JP | 08171822 | 7/1996 |
| WO | WO 94/03955 | 2/1994 |
| WO | 98/14961 | 4/1998 |
| WO | WO 98/14961 | 4/1998 |
| WO | WO 00/10176 | 2/2000 |
| WO | WO 00/57493 | 9/2000 |

* cited by examiner

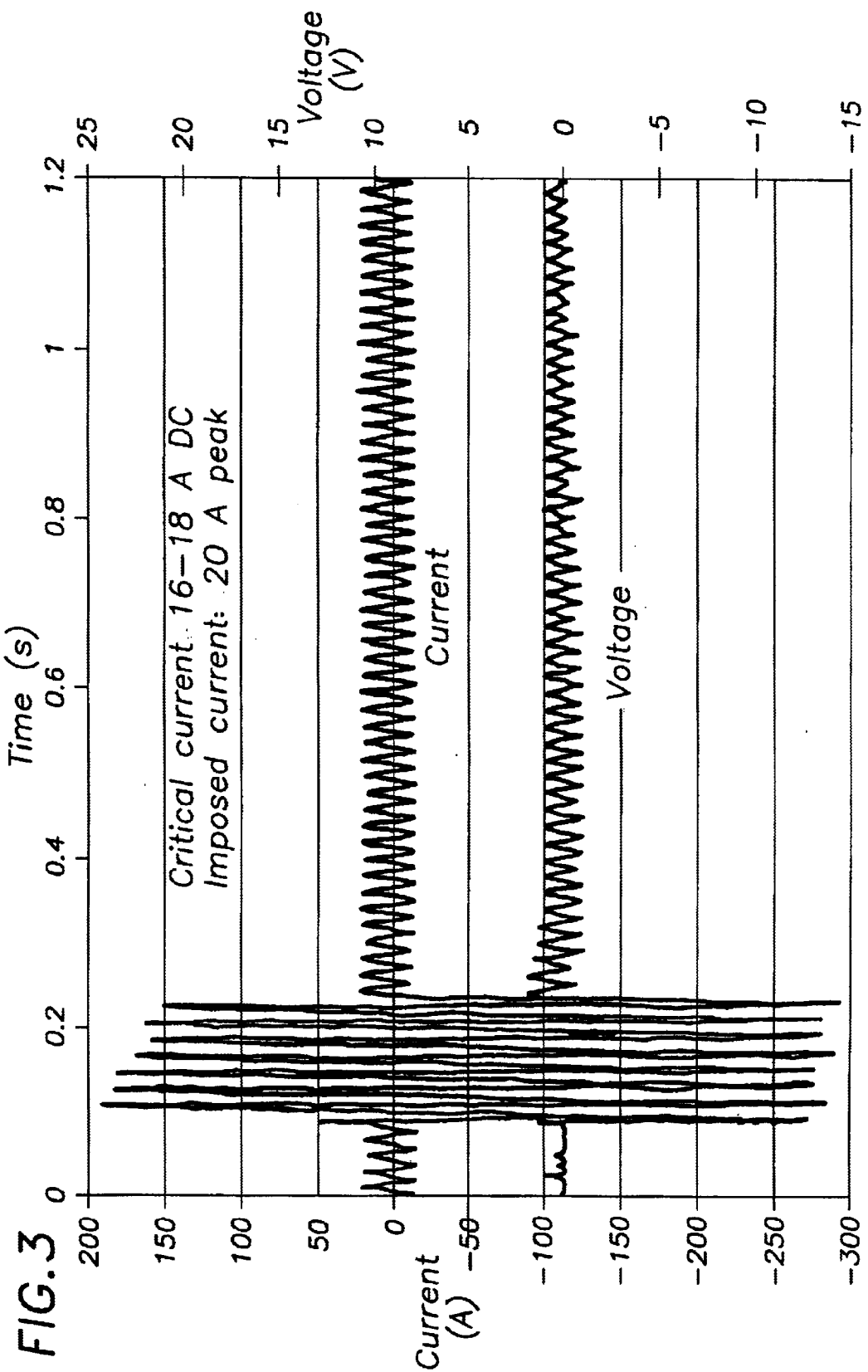

CURRENT LIMITING COMPOSITE MATERIAL

CROSS REFERENCE TO RELATED APPLICATIONS

This application is a continuation-in-part application of U.S. application Ser. No. 09/274,438, filed Mar. 22, 1999 (now abandoned), which is a continuation-in-part of U.S. application Ser. No. 09/240,998, filed Feb. 1, 1999 (now U.S. Pat. No. 6,188,921), Ser. No. 09/200,411, filed Nov. 25, 1998 (now U.S. Pat. No. 6,657,533), and Ser. No. 09/132,592, filed Aug. 11, 1998 (now abandoned). U.S. application Ser. No. 09/240,998 claims benefit of priority under 35 U.S.C. 119(e) of U.S. provisional application Ser. No. 60/074,258, filed Feb. 10, 1998. All of these related applications are incorporated herein by reference:

FIELD OF THE INVENTION

The present invention is related to composite materials exhibiting current limiting behavior and the ability to recover rapidly from fault current events.

BACKGROUND OF THE INVENTION

Fault currents are large (usually temporary) increases in the normal operating current flowing in a power transmission system. A fault current can occur from any number of different events including lightning strikes or catastrophic failure of electrical equipment which can cause short circuits. A short circuit, for example, can cause a twenty-fold or more increase in current flowing through the circuit.

Conventional circuit breakers are used in virtually every power transmission and distribution system to "open" the circuit and interrupt current flow in the event of a fault. The fault current level grows as new equipment is added over time. However, with an increase in the magnitude of fault current comes an increase in the size and expense of the circuit breaker. Moreover, conventional circuit breakers do not open instantaneously. The fault current is generally first detected by a current sensor which generates a signal to a control circuit. The control circuit processes the signal and then generates a control signal to open the circuit breaker. During these steps (which may have a duration as long as 50–2000 msec or more), the circuit breaker, as well as other parts of the transmission system, are subjected to the higher fault current level. Thus, the circuit breaker, transformers and other components of the system are often rated to withstand the higher current levels for a period of time.

Fault current limiters were developed to insert impedance in a connection quickly so as to reduce the magnitude of the fault current, thereby protecting the circuit breaker and the power transmission system. Many fault current limiters include tuned reactance circuits which store energy in proportion to the circuit inductance.

Often a circuit breaker will be designed to automatically reclose a short time after it opens, in case a transient fault has cleared. It is therefore desirable for a fault current limiter to exhibit fast recovery characteristics, so that it will function when the circuit breaker recloses.

An important property of a superconductor is the disappearance of its electrical resistance when it is cooled below a critical temperature $T_c$. For a given magnetic field and temperature below $T_c$, there exists a characteristic critical current $I_c$, below which the superconductor will exhibit virtually no resistance. Above $I_c$, the resistance (and electric field) increase very rapidly. If the superconductor is embedded or co-wound with a conductive matrix, current is divided between the superconductor and the matrix as a parallel circuit. (Below $I_c$, the superconductor carries substantially all of the current because of its zero resistance).

The transition characteristics of superconducting materials have been used advantageously to develop superconducting fault current limiters. For example, in one conventional approach, a superconducting current limiting device is constructed using a thin coating of superconducting material deposited onto a surface of a heat-dissipating wafer (e.g., sapphire). When a fault is detected, the coating transitions into its normal state and becomes resistive, thereby limiting the flow of current until a circuit breaker, in series with the device, interrupts the current flow. In other approaches, bulk superconducting rods or rings are used in devices which inductively limit the level of fault currents.

Present fault current limiters, whether they be stand alone devices or integrated into the devices which they are intended to protect, consist of a plurality of discrete electrical components. An elongated composite material which inherently possesses current limiting capability would enable simpler designs integrating fault current limiting functionality. For instance, such a conductor could be incorporated in the windings of a transformer resulting in a fault current limiting transformer. This concept defines a need for a current limiting elongated composite material that exhibits a desirable electrical field in the presence of a fault current that is greater than the steady state peak current.

SUMMARY OF THE INVENTION

In one aspect, the invention comprises an elongated current limiting composite, comprising an oxide superconducting member and a second electrically conductive member substantially surrounding the oxide superconducting member. The composite has fault limiting properties as follows: when a current of about 3–10 times the operating current is passed through the composite, it exhibits an electric field of about 0.05–0.5 V/cm. The operating current is between about one half the critical current and about the critical current at a selected operating temperature, the operating temperature being less than the critical temperature of the superconductor.

The electrically conductive member may be a silver-containing matrix, which may further include gallium, tin, cadmium, zinc, indium, and antimony. It may also comprise a bonding agent such as an adhesive or solder, which may bond a thermal stabilizing element to the matrix. The thermal stabilizing element may comprise, for example, stainless steel or a copper alloy. The composite may be in the form of a wire.

In some embodiments, the heat capacity of the composite is selected to be sufficient to prevent the composite temperature from rising above the critical temperature of the at least one oxide superconducting member during a fault event. This heat capacity may be calculated according to Equation (2), infra, for a fault lasting 50, 150, 250, 500, 1000, or 2000 msec. In other embodiments, the composite may be configured so that sufficient heat can be dissipated from the composite after a fault event to allow the composite to cool to the operating temperature. This configuration may be determined with reference to Equation (3), infra, for a fault lasting 50, 150, 250, 500, 1000, or 2000 msec. For still other embodiments, both Equation (2) and Equation (3) may be satisfied for faults lasting 50, 150, 250, 500, 1000, or 2000 msec.

In other aspects, the invention comprises a current-limiting transformer, having a composite as described above in electrical series with its windings. The transformer may further comprise integrated cooling means for holding the transformer at the operating temperature. The invention further comprises a current limiter comprising the composite described above and integrated cooling means for holding the composite at the operating temperature.

In still other aspects, the invention comprises a method of limiting current during a fault event in a power transmission system carrying an operating current. The method comprises interposing a superconducting composite comprising a superconducting oxide member substantially surrounded by a second conductor, where the composite can carry the operating current of at least half the critical current with a voltage gradient of less than 1 $\mu$V/cm in the absence of a fault, and exhibits a voltage gradient in the range of 0.05–0.5 V/cm in the presence of a fault in which the system carries a current of about 3–10 times the operating current.

The second conductor may be a silver-containing matrix, which may further comprise gallium, tin, cadmium, zinc, indium, or antimony. It may also comprise a bonding agent such as adhesive or solder, which may act to bond a thermal stabilizing element to the matrix. This thermal stabilizing element may be, for example, stainless steel or a copper alloy. The composite may be configured in the form of a wire, and may also be configured so that it does not rise above the critical temperature of the superconductor during a fault event.

The composite may further be placed in electrical series relation with a circuit breaker which interrupts current in response to a fault event, for example after a period of 50–2000 msec, a period of 100–1000 msec, or a period of 200–500 msec.

Unless otherwise noted, "matrix resistivity" refers to bulk resistivity of the matrix which is determined across the many grains of the matrix material along the wire axis, while "composite resistivity" refers to the resistivity of the composite article, including superconducting element(s), matrix, and any additional laminated components.

By "operating current density" of a superconducting composite as that term is used herein, it is meant the total current passing through both superconductor and matrix of the composite, divided by the cross-sectional area of the composite, including superconducting oxide filament(s), matrix, and any other components through which current may pass. This quantity is denoted by $J_{op}$.

By "engineering critical current density" as that term is used herein, it is meant the total critical current of the superconducting members of a superconducting composite, divided by the cross-sectional area of the entire composite, including both superconducting oxide filaments and conductive matrix. This quantity is denoted by $J_e$.

By "critical current" as that term is used herein, it is meant that the current at which there is a dissipation of 1 $\mu$V/cm for DC applications, or 1 mW/A-m for AC applications.

BRIEF DESCRIPTION OF THE DRAWING

The invention is described with reference to the several figures of the drawing, in which.

FIG. 3 illustrates current and voltage traces during a fault event showing the quick recovery characteristics of composites according to the invention.

DETAILED DESCRIPTION

Figure 1A:
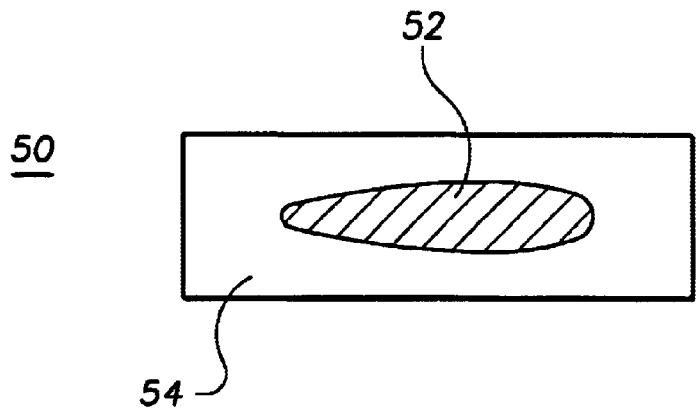
FIGS. 1a, 1b and 1c illustrate various embodiments of superconducting oxide composites in accordance with the present invention.

The present invention includes the use of superconducting composites with high matrix resistivities as fault current limiters. Prior fault current limiters, whether they be stand alone devices or integrated into the devices which they are intended to protect, consist of a plurality of discrete electrical components (e.g., separate shunt resistors, as described in U.S. Pat. No. 5,828,291 to Baumann et al., incorporated herein by reference). The present invention provides an elongated composite material that exhibits current limiting capability, enabling simpler fault current limiter designs. For instance, such a conductor can be incorporated in the windings of a transformer resulting in a fault current limiting transformer. Furthermore, the fault current limiters of the invention can exhibit nearly instantaneous operational recovery after a fault event.

In typical power transmission systems, there are a plurality of circuit breakers provided for different feeders, as well as (generally larger) busbar breakers which control a plurality of feeders. When a fault occurs in one of the feeders, the circuit breaker in that feeder opens to protect the circuit (typically within 50–200 msec, but longer delays may be seen in some circumstances). If the feeder circuit breaker fails, the main busbar breaker opens (typically after a period of 300 msec or more), leaving all feeders connected to the busbar without electricity. In more complicated systems, there may be several layers of circuit breakers, so that the cycle of determining whether the breaker closest to the fault has opened, and determining which upstream breaker to open if it has not, may be repeated several times, extending the duration for which the system is exposed to the fault current. With conventional switchgear and transformers, delays of 1–5 seconds are typical, although utilities are attempting to reduce these delays to around one second by applying modern control equipment.

In superconducting composites which comprise one or more oxide filaments encased in a metal sheath, the sheath material and the superconductor constitute a parallel circuit. When the current is increased to a level above the critical current of the superconducting element, its resistivity is abruptly increased to high levels (greater than 25 $\mu\Omega$-cm). Significantly more current may then flow through the sheath material. According to the present invention, for a given voltage, this excess current is limited by providing a composite having a high resistivity sheath (e.g., a resistivity of at least 3 $\mu\Omega$-cm, and preferably of about 5–25 $\mu\Omega$-cm).

Detailed information about methods of producing composites having these high sheath resisitivities is provided in parent applications U.S. Ser. No. 09/274,438, filed Mar. 22, 1999, and U.S. Ser. No. 09/240,998, filed Feb. 1, 1999, and in PCT publication WO99/40633, all of which are incorporated herein by reference. These methods attain a high matrix resistivity by formation of a solid solution of the matrix metal with at least one solute element. The solute desirably comprises one or more elements which result in a large increase in the resistivity of the matrix material when added in modest quantities.

Suitable alloying elements are capable of imparting resistivity to the matrix, such that the bulk resistivity of the matrix increases. Elements with the greatest impact on alloy resistance are generally most preferred; however, suitable elements also demonstrate high diffusivity in silver and the ability to form solid solutions with silver at low temperatures. Suitable solute metals which are anticipated to form high resistivity, solid-solution alloys with silver under mild conditions include tin (Sn), gallium (Ga), cadmium (Cd), zinc (Zn), indium (In) and antimony (Sb) and alloys thereof. One or more solute elements may be used.

Many solute elements will degrade a superconducting oxide when present under reactive conditions. It is therefore desirable that such conditions be avoided when the solute element is present in the matrix. This is difficult when the alloyed matrix is formed before the oxide superconductor, since the conditions under which the oxide superconductor is formed are necessarily reactive conditions. Therefore, the high resistivity component preferably is introduced at low temperatures and at a point in the manufacture of the superconducting composite when no further treatments under reactive conditions will occur.

The alloying process may be accomplished by heating the oxide superconductor composite in the presence of a solute (e.g., in a solute bath), or by depositing the solute composition onto an exterior surface of the oxide superconductor composite and heating, thereby diffusing the solute into the matrix.

Long lengths of coated superconducting composite tape can be annealed to diffuse a solute into the matrix in a batch process by coating the tape with a separating agent, such as a slurry of oxide or other particles (e.g., MgO particles). In preferred embodiments, the slurry is applied and allowed to dry, leaving a coating of fine particles on the surface of the matrix, which prevents adjacent regions of the tape from sticking to one another when the tape is wound on a mandrel or reel. Flat strips of separating material, or a porous coating such as that described in U.S. Pat. No. 5,952,270, may also be used, but attention should be paid to minimizing mechanical damage caused by differences in thermal expansion coefficients of the separator and the superconducting composite. Coating with particles is preferred because the small particles can move apart from one another as the composite expands with heating, minimizing thermal mismatch damage.

After application of the separating agent, the tape can be wound on a reel to form a pancake coil (e.g., as disclosed in U.S. Pat. No. 5,952,270, which is incorporated herein by reference), which can then be laid flat in a furnace and diffusion heat treated. The separating agent allows the treated composite to be easily unwound and separated after heat treating. Alternatively, heat treatment may also be carried out by winding the coated tape on a mandrel (e.g., an alumina mandrel), either in a single layer or in multiple layers. In preferred embodiments of the invention, the resistivity of the composite is monitored during heat treatment, so that the desired sheath resistivity for the composite is obtained.

The invention may be practiced with any desired oxide superconductor or its precursors. By "desired oxide superconductor" is meant the oxide superconductor intended for eventual use in the finished article. Typically, the desired oxide superconductor is selected for its superior electrical properties, such as high critical temperature or critical current density. The desired oxide superconductor is typically a member of a superconducting oxide family which has demonstrated superior electrical properties, for example, BSCCO 2223 (including BSCCO (2.1)223) or BSCCO 2212 in the BSCCO family. By "precursor" is meant any material that can be converted to an oxide superconductor upon application of a suitable heat treatment. Precursors may include any combination of elements, metal salts, oxides, suboxides, oxide superconductors which are intermediate to the desired oxide superconductor, or other compounds which, when reacted in the stability field of a desired oxide superconductor, produces that superconductor. For example, there may be included elements, salts, or oxides of copper, yttrium, and barium for the YBCO family of oxide superconductors; elements or oxides of copper, bismuth, strontium, and calcium, and optionally lead, for the BSCCO family of oxide superconductors; elements, salts, or oxides of copper, thallium, calcium and barium or strontium, and optionally, bismuth and lead, for the thallium (TBSCCO) family of oxide superconductors; elements, salts, or oxides of copper, mercury, calcium, barium or strontium, and optionally, bismuth and lead, for the mercury (HBSCCO) family of oxide superconductors. The YBCO family of oxide superconductors is considered to include all oxide superconductors of the type comprising barium, copper, and a rare earth selected from the group consisting of yttrium, lanthanum, neodymium, samarium, europium, gadolinium, terbium, dysprosium, holmium, erbium, thulium, ytterbium, and lutetium. By "oxide superconductor intermediate to the desired oxide superconductor" is meant any oxide superconductor which is capable of being converted to the desired oxide superconductor. The formation of an intermediate may be desired in order to take advantage of desirable processing properties, for example, a micaceous structure amenable to texturing, which may not be equally possessed by the desired superconducting oxide. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. Thalliation, the addition of doping materials, including but not limited to the optional materials identified above, variations in proportions and such other variations in the precursors of the desired superconducting oxides as are well known in the art, are also within the scope and spirit of the invention.

The three-layer, high-$T_c$ phase of a member of the BSCCO family of superconductors (BSCCO 2223 and (2.1) 223), such as $Bi_2Sr_2Ca_2Cu_3O_x$ or $[Bi_{1-y}Pb_y]_2Sr_2Ca_2Cu_3O_x$ (0<y<0.5), is the desired superconducting oxide most preferred for the operation of the present invention. Composites including BSCCO 2223 have demonstrated the potential for superior mechanical and electrical performance at long lengths when adequately textured. $Bi_2Sr_2Ca_1Cu_2O_x$ and $[Bi_{1-y}Pb_y]_2Sr_2Ca_1Cu_2O_x$ (BSCCO 2212) are also preferred materials for the practice of the invention.

Figure 1B:
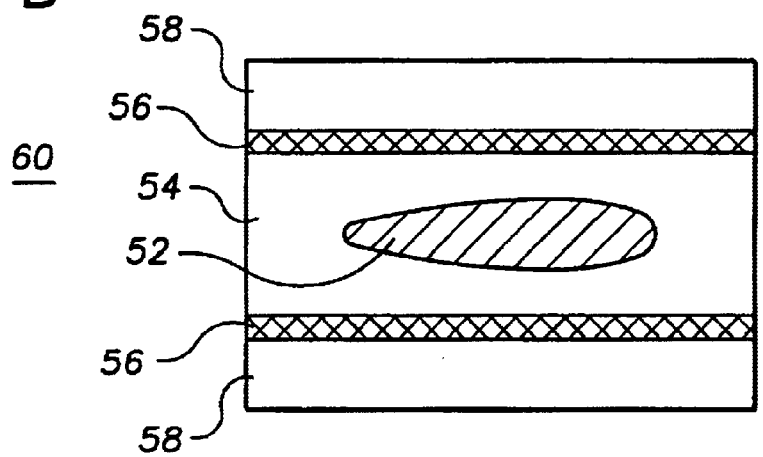
Figure 1C:
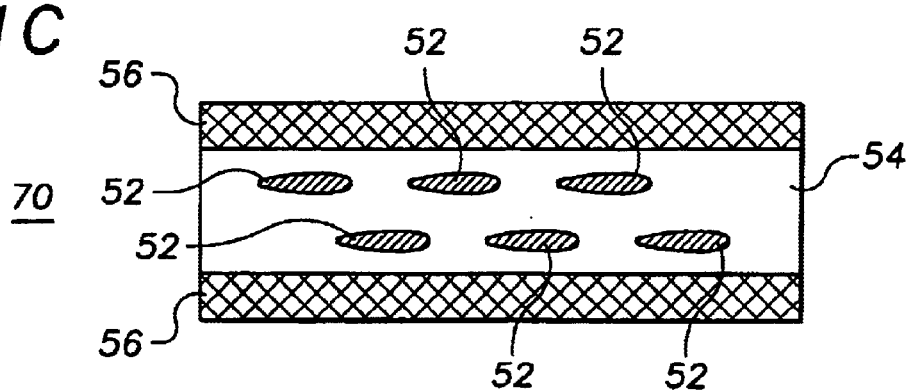

In accordance with the invention, composite materials are provided that exhibit current limiting functionality as well as recovery functionality. FIGS. 1a–1c illustrate exemplary current limiting composite materials (that may be also exhibit recovery functionality) in accordance with the present invention.

For example, FIG. 1a shows a superconducting composite 50 that includes at least one oxide superconducting material 52 (e.g. a high temperature oxide superconductor such as BSCCO 2212, BSCCO 2223, Rare Earth-BCO) and a second electrically conductive material which has less electrical conductivity than oxide superconductor 52. In this embodiment, the second electrically conductive material is matrix material 54 (e.g. a metal alloy such as a silver alloy, a copper alloy or a nickel alloy) substantially surrounding the at least one oxide superconducting material 52. In some embodiments, the matrix material 54 may be in contact with the oxide superconducting material 52. Preferably, matrix material 54 contains at least one other element selected from the group consisting of gallium, tin, cadmium, zinc, indium and antimony.

FIG. 1b shows another embodiment of a current limiting composite according to the invention. Composite 60 includes oxide superconductor 52 (e.g., a high temperature oxide superconductor such as BSCCO 2212, BSCCO 2223, Rare Earth-BCO) and a second electrically conductive material which has less electrical conductivity than oxide superconductor 52. In this embodiment, the second electrically conductive material includes matrix material 54 (e.g., a metal alloy such as a silver alloy, a copper alloy or a nickel alloy) that may substantially surround the at least one oxide superconducting material 52. In some embodiments, the matrix material 54 may be in contact with the oxide superconducting material 52. Preferably, matrix material 54 contains at least one other element selected from the group consisting of gallium, tin, cadmium, zinc, indium and antimony.

In addition, the second electrically conductive material may include at least one bonding agent 56 thermally connected to the matrix material 54. Optionally, the second electrically conductive material may also include a thermal stabilizing element 58 thermally connected to the bonding agent.

While not to be construed as limiting, exemplary bonding agents include solders (for example, such as 50–50 weight % indium-lead, 60 weight % bismuth, 40 weight % lead or bismuth-tin), adhesives (epoxies, urethanes and the like), thermoplastics and the like. Thermal stabilizing element 58 may be formed, for example, from stainless steel, a copper alloy (with at least 3 weight percent titanium and 0–5 weight percent silicon), a nickel alloy or an iron alloy.

Composites 50 and 60 shown respectively in FIG. 1a and FIG. 1b can be configured as a monofilament (PIT) composite or as a coated conductor. The present invention also encompasses multifilament powder-in-tube (PIT) and multilayer embodiments. For example, FIG. 1c illustrates composite 70 which is similar to FIG. 1a, but includes additional filaments of oxide superconductor 52 as well as bonding agent 56.

The embodiments shown in FIGS. 1a–1c provide current limiting functionality and in some cases, the ability to recover rapidly from a fault current event. Current limiting functionality requires high voltage gradients (e.g., 0.05–0.5 V/cm) at 3–10 times the operating current ($I_{op}$). Operating current ($I_{op}$) is the current at steady state, nominal operating conditions and typically has an associated voltage gradient less than about 1 $\mu$V/cm in DC use and less than about 1 mW/A-m in AC use. In typical fault current limiting applications, the critical current of the composite material will be selected to have a value higher than the nominal operating current to allow for normal variations, but not so high as to allow dangerous levels of current to flow through the system without triggering the current-limiting features of the invention.

When a fault occurs, a large voltage is imposed across the device, and the current surges to values much larger than the steady state operating current. As the current in the superconductor increases above $I_c$, the resistance of the oxide superconductor increases dramatically, thereby limiting the amount of current flowing in response to the fault. The amount of current limiting that can occur for a given length of composite depends on its overall effective resistance per unit length. A sufficiently high resistivity is required for the matrix to ensure that its resistance in parallel with the superconductor does not provide a low resistance path for fault currents and to maintain a large resistance per unit length of the composite for fault currents. The general characteristics of composites according to the invention are thus defined as follows:

$$\frac{\rho_{composite}}{A_{composite}} = \frac{0.05 \text{ to } 0.5 \frac{V}{cm}}{(3 \text{ to } 10)I_{op}} \tag{1}$$

where $\rho_{composite}$ is the resistivity of the composite, and $A_{composite}$ is the cross-sectional area of the composite.

To achieve the desired instantaneous recovery, the temperature of the superconductor at the end of the fault should be less than its critical temperature. This limitation requires a high heat capacity material in the composite to thermally stabilize it, so that resistive heating will not cause the superconductor to reach too high a temperature. Preferably, a high heat capacity material forms a part or all of the second electrically conductive member of the composite.

High heat capacity materials suitable for use in the present invention include, but are not limited to, stainless steel based, copper based, iron based and nickel based alloys. The heat capacity for suitable materials is given by the following equation:

$$C_p \times \text{density} \times [T_c - T_{op}] \times \frac{\rho_{el}}{V^2} > t \tag{2}$$

where $C_p$ is the average specific heat for the composite, density is the average density for the composite, $T_c$ is the critical temperature of the superconductor (i.e., the temperature below which the superconductor exhibits superconducting properties), $T_{op}$ is the steady state operating temperature of the composite, $\rho_{el}$ is the current dependent average resistivity of the composite, averaged over the duration of the fault event, V is the voltage gradient along the composite, and t is the time (i.e., duration) of the fault.

In addition to the above heat capacity criterion, the current limiter in use must be able to transfer to the environment the heat generated by the steady state operating current once the fault has cleared. This requirement can be expressed as a constraint on the heat flux at the surface of the composite as follows:

$$J_{op}^2 \times \rho^*_{el} < h \times (T_c - T_{op}) \times \alpha \tag{3}$$

where $J_{op}$ is the operating current density, $\rho^*_{el}$ is the current dependent average resistivity of the composite at the end of the fault event (this will generally be the peak resistivity), h is the effective heat transfer coefficient, $T_c$ and $T_{op}$ are as defined above, and $\alpha$ is a form factor which reflects the ratio of the surface area for heat transfer to the volume of the composite. For example, when a conductor of rectangular cross section (w×d) is cooled on all four sides, the form factor is about $$\frac{2(w+d)}{w \times d},$$

while for the same conductor cooled on one side, the form factor is about 1/d. Those skilled in the art will recognize that the calculation of form factor and effective heat transfer coefficient from first principles is an inexact art, and that these factors may often be more conveniently determined empirically.

To simultaneously achieve the desired current limiting functionality and recovery functionality, a composite according to the invention will preferably have a high electrical resistivity of the second electrically conductive material (e.g., greater than 3 $\mu\Omega$-cm), and a high heat capacity (>1–2 $J/cm^3$ K). To simultaneously achieve the desired current limiting functionality and recovery functionality based on the above criteria, it will be appreciated by one skilled in the art that there is an optimum balance between the area and the volume of the composite. In some embodiments, a low area and high volume may be desirable.

EXAMPLES

Example 1
Superconducting Composite Having High Matrix Resistivity

About 10–13 weight % Ga (with respect to Ag content) was deposited on the surface of a superconducting tape comprising BSCCO filaments in a silver sheath, using electroplating techniques and a reel to reel electroplating line. After plating, the Ga was diffused into the sheath, making a high resistance Ag-Ga solid solution alloy. A representative "witness" sample was cut from a long length of the plated composite and was used to monitor the diffusion process. The witness sample allowed the sheath resistance to be continually measured during the diffusion process using a four-point probe measurement. The witness sample and the long length coil were placed in a convection furnace. The furnace was ramped up to 425° C. in air at a rate of 10° C./min, and was allowed to dwell at this temperature until the resistance of the witness sample achieved a value of 9.62 m$\Omega$/cm. Once this value had been achieved, the furnace was rapidly cooled to room temperature. After cooling, the resistance of the tape was found to be 6.6 m$\Omega$/cm. The resistance value at 425 ° C. which is used to determine when to shut down the furnace can be empirically or theoretically established in order to achieve the desired room temperature resistance (6.6 m$\Omega$/cm in this case).

After the diffusion process, a gallium oxide skin was present on the surface of the tape. This oxide layer was chemically removed prior to subsequent lamination processing as described below, using a 50% nitric acid solution containing 90 g/l of ammonium bifluoride. The etching solution was heated to 48° C. and the diffused tape was run through the solution (maintaining a 5 sec residence time) using a reel to reel etching line. Once the tape was chemically stripped of its gallium oxide layer, it was readily soldered during the lamination process.

The lamination process was used to provide both mechanical and thermal stabilization for the strand. Using reel to reel processing machinery and a wave solder pot, the gallium post processed wire was bonded to a stainless steel stabilizer using a 50/50 lead-indium solder.

Example 2
Thermally Stabilized Current Limiting Composite

A HTS monofilament conductor having a nominally pure silver sheath and a BSCCO-2223 superconductor filament and a nominal width of 2.5 mm and a nominal thickness of 0.11 mm was electroplated with gallium to provide a final average composition of 6.1 wt. % gallium in the silver. The conductor was coated with a slurry of MgO particles, which was allowed to dry, leaving a fine coating of particles on the surface. The gallium was then allowed to diffuse into the silver by heating the coated monofilament to 450 C for 4 hours.

The resulting conductor had a sheath resistivity of nominally 3 $\mu\Omega$-cm at 77 K and a nominal DC critical current of 16A at 77 K in self-field at 1 $\mu$V/cm. Stainless steel members nominally 2.0 mm wide and 0.1 mm thick were then soldered to each face of a nominally 100 mm long sample. Thermally conductive grease was then applied to this structure which was then sandwiched between two copper members about 0.5 mm thick.

Figure 2:
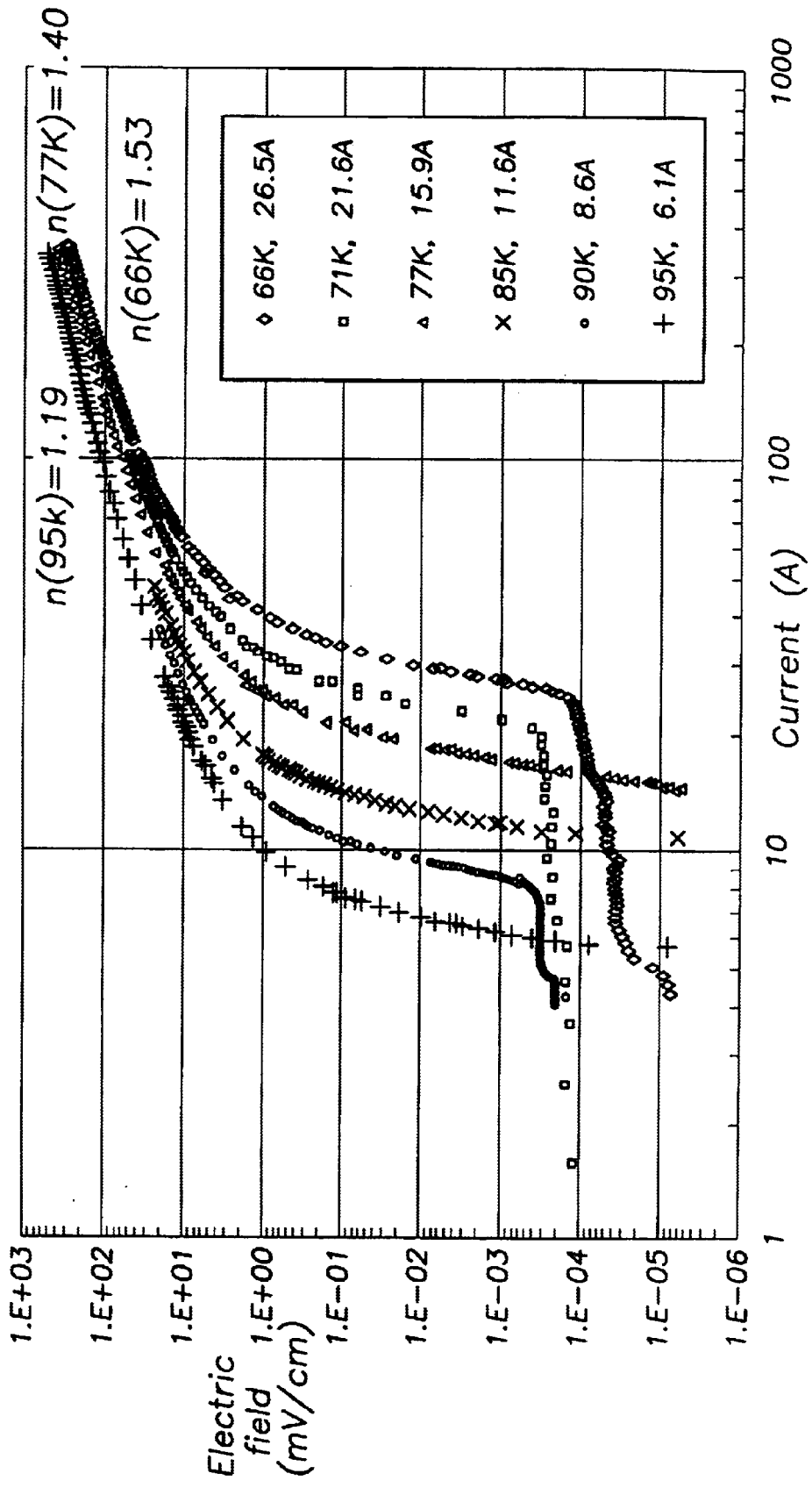
FIG. 2 illustrates the extended (i.e., including currents well beyond the critical current) electric field vs. current characteristics of an oxide superconductor composite at temperatures between 66 K–95 K.

The electric field response of the above thermally stabilized sample was measured while applying current pulses of up to about 350A. These measurements were made at 6 temperatures between 66 and 95 K; the resulting data are plotted in FIG. 2 and show high resistances in response to high currents. At 77 K, the critical current, $I_c$, corresponding to a dissipation of $1\times10^{-6}$ V/cm (1 $\mu$V/cm) is seen to be 16A. For currents of $3*I_c$ (48A) the electric field is about 0.03 V/cm and at $10*I_c$ (160A) the electric field is about 0.1V/cm.

FIG. 3 shows current and voltage traces of a 1 m section of another composite conductor according to the invention. The composite conductor had a critical DC current of about 16–18 A, and was sandwiched between two stainless steel tapes of about ten times its thickness by means of a high resistivity solder. Current and voltage were measured before, during, and after a fault event of 150 ms duration. It will be seen that normal properties were quickly recovered after the fault.

FIG. 3 demonstrates that composites according to the invention can operate at the steady state current $I_{op}$ immediately after the fault without thermal runaway (heating to temperatures above $T_c$). After the fault event, the rms voltage across the composite is seen to slowly decay to lower values, indicating that there is sufficient heat transfer for the temperature to decrease back to its steady state value.

Measurements on tapes of up to 80 m in length have further confirmed the feasibility of fast recovery of current limiters according to the invention. Rapid recovery has been observed for faults of up to about 250 msec, and it is contemplated that rapid recovery may be achieved according to the invention for faults as long as about 500 msec, about 1000 msec, or even several seconds.

Other embodiments of the invention will be apparent to those skilled in the art from a consideration of the specification or practice of the invention as disclosed herein. It is intended that the specification and examples be considered as exemplary only, with the true scope and spirit of the invention being indicated by the following claims.

What is claimed is:

1. An elongated current limiting composite, comprising:
   at least one oxide superconducting member; and
   at least one second electrically conductive member substantially surrounding the at least one oxide superconducting member,
   wherein the composite exhibits an electric field in the range of about 0.05–0.5 V/cm during a fault current limiting event, wherein a fault current limiting event comprises passing about 3–10 times an operating current through the composite, the operating current selected to be less than or about equal to the critical current of the oxide superconductor and greater than or about equal to one-half the critical current of the oxide superconductor at a selected operating temperature less than the critical temperature of the at least one oxide superconducting member.

2. The composite of claim 1, wherein the second electrically conductive member comprises a silver-containing matrix.

3. The composite of claim 2, wherein the silver-containing matrix further includes at least one element selected from the group consisting of gallium, tin, cadmium, zinc, indium, and antimony.

4. The composite of claim 2, wherein the second electrically conductive member further comprises at least one bonding agent thermally connected to the matrix.

5. The composite of claim 4, wherein the second electrically conductive member further comprises at least one thermal stabilizing element thermally connected to the at least one bonding agent.

6. The composite of claim 5, wherein the at least one thermal stabilizing element comprises stainless steel.

7. The composite of claim 6, wherein the bonding agent comprises an adhesive or solder.

8. The composite of claim 5, wherein the at least one thermal stabilizing element comprises a copper alloy containing at least 3 weight % titanium and 0–5 weight % silicon.

9. The composite of claim 8, wherein the bonding agent comprises an adhesive or solder.

10. The composite of claim 5, wherein the composite is in the form of a wire.

11. The composite of claim 1, wherein the heat capacity of the composite is sufficient to prevent the composite temperature from rising above the critical temperature of the at least one superconducting oxide member during a fault event.

12. The composite of claim 11, wherein $$C_p \times \text{density} \times [T_c - T_{op}] \times \frac{\rho_{el}}{V^2} > t$$

where $C_p$ is the average specific heat for the composite, density is the average density for the composite, $T_c$ is the critical temperature of the superconducting member, $T_{op}$ is the operating temperature, $\rho_{el}$, is the current dependent average resistivity of the composite, averaged over the duration of a fault event of duration t, V is the voltage gradient along the composite, and t is about 50 msec.

13. The composite of claim 12, wherein t is about 150 msec.

14. The composite of claim 12, wherein t is about 250 msec.

15. The composite of claim 12, wherein t is about 500 msec.

16. The composite of claim 12, wherein t is about 1000 msec.

17. The composite of claim 12, wherein t is about 2000 msec.

18. The composite of claim 1, wherein sufficient heat can be dissipated from the composite while carrying the operating current after a fault event to allow the composite to cool to the operating temperature.

19. The composite of claim 18, wherein $$J_{op}^2 \times \rho^*_{el} < h \times (T_c - T_{op}) \times \alpha$$

where $J_{op}$ is the operating current density, h is the effective heat transfer coefficient of the composite, $T_c$ is the critical temperature of the superconducting member, $T_{op}$ is the operating temperature, $\alpha$ is the form factor of the composite, and $\rho^*_{el}$ is the current dependent average resistivity of the composite at the end of a fault event of 50 msec duration.

20. The composite of claim 19, wherein $\rho^*_{el}$ is the current dependent average resistivity of the composite at the end of a fault event of 150 msec duration.

21. The composite of claim 19, wherein $\rho^*_{el}$ is the current dependent average resistivity of the composite at the end of a fault event of 250 msec duration.

22. The composite of claim 19, wherein $\rho^*_{el}$ is the current dependent average resistivity of the composite at the end of a fault event of 500 msec duration.

23. The composite of claim 19, wherein $\rho^*_{el}$ is the current dependent average resistivity of the composite at the end of a fault event of 1000 msec duration.

24. The composite of claim 19, wherein $\rho^*_{el}$ is the current dependent average resistivity of the composite at the end of a fault event of 2000 msec duration.

25. The composite of claim 1, wherein the heat capacity of the composite is sufficient to prevent the composite temperature from rising above the critical temperature of the at least one superconducting oxide member during a fault event and wherein sufficient heat can be dissipated from the composite while carrying the operating current after a fault event to allow the composite to cool to the operating temperature.

26. The composite of claim 25, wherein $$C_p \times \text{density} \times [T_c - T_{op}] \times \frac{\rho_{el}}{V^2} > t$$

and wherein $$J_{op}^2 \times \rho^*_{el} < h \times (T_c - T_{op}) \times \alpha$$

where $C_p$ is the average specific heat for the composite, density is the average density for the composite, $T_c$ is the critical temperature of the superconducting member, $T_{op}$ is the operating temperature, $\rho_{el}$ is the current dependent average resistivity of the composite, averaged over the duration of a fault event of duration t, $\rho_{el}^*$ is the current dependent average resistivity of the composite at the end of a fault event of duration t, V is the voltage gradient along the composite, $J_{op}$ is the operating current density, h is the effective heat transfer coefficient of the composite, $\alpha$ is the form factor of the composite, and t is about 50 msec.

27. The composite of claim 26, wherein t is about 150 msec.

28. The composite of claim 26, wherein t is about 250 msec.

29. The composite of claim 26, wherein t is about 500 msec.

30. The composite of claim 26, wherein t is about 1000 msec.

31. The composite of claim 26, wherein t is about 2000 msec.

* * * * *